(12) United States Patent
Michler et al.

(10) Patent No.: US 12,013,195 B2
(45) Date of Patent: Jun. 18, 2024

(54) COOLING DEVICE FOR COOLING A SEPARATE OBJECT TO BE COOLED

(71) Applicant: apt Extrusions GmbH & Co. KG, Monheim am Rhein (DE)

(72) Inventors: Stefan Michler, Burscheid (DE); Thomas Brieden, Düsseldorf (DE)

(73) Assignee: APT EXTRUSIONS GMBH & CO. KG, Monheim am Rhein (DE)

( * ) Notice: Subject to any disclaimer, the term of this patent is extended or adjusted under 35 U.S.C. 154(b) by 401 days.

(21) Appl. No.: 17/441,432

(22) PCT Filed: Mar. 11, 2020

(86) PCT No.: PCT/EP2020/056451
§ 371 (c)(1),
(2) Date: Sep. 21, 2021

(87) PCT Pub. No.: WO2020/187657
PCT Pub. Date: Sep. 24, 2020

(65) Prior Publication Data
US 2022/0178625 A1    Jun. 9, 2022

(30) Foreign Application Priority Data

Mar. 21, 2019 (DE) .......................... 102019107280.8

(51) Int. Cl.
*F28F 3/06* (2006.01)
*H01L 21/48* (2006.01)

(52) U.S. Cl.
CPC ............ *F28F 3/06* (2013.01); *H01L 21/4882* (2013.01); *F28F 2215/10* (2013.01); *F28F 2255/16* (2013.01); *F28F 2275/085* (2013.01)

(58) Field of Classification Search
CPC ............. F28F 2275/085; F28F 2255/16; F28F 2215/10; F28F 3/06; H01L 21/4882; H01L 23/3672
(Continued)

(56) References Cited

U.S. PATENT DOCUMENTS 4,660,123 A * 4/1987 Hermann ............ H01L 23/4093
174/16.3
5,170,325 A * 12/1992 Bentz .................. H01L 23/4093
24/457

(Continued)

FOREIGN PATENT DOCUMENTS

DE     3024748      2/1982
DE     3024748 A1 * 2/1982
(Continued)

OTHER PUBLICATIONS

PCT International Search Report (w/ English translation) for corresponding PCT Application No. PCT/EP2020/056451, mailed on Jun. 19, 2020, 7 pages.

*Primary Examiner* — Eric S Ruppert
*Assistant Examiner* — Hans R Weiland
(74) *Attorney, Agent, or Firm* — Dority & Manning, P.A.

(57) ABSTRACT

Cooling device for cooling a separate object to be cooled, in particular a technical component, wherein the cooling device comprises at least one cooling-rib body comprising a plurality of cooling ribs, and at least one main body that is open on at least one side, in particular when viewed in cross section, and defines a receiving space configured to receive at least one cooling-rib body, wherein the at least one cooling-rib body comprises at least one fastening element, which is configured to interact with the at least one main-body-side fastening element to form a fastening between the at least one cooling-rib body received in the receiving space and the main body, and the main body comprises at least one (Continued)

fastening element, which is configured to interact with at least one cooling-rib-body-side fastening element to form a fastening between the at least one cooling-rib body received in the receiving space and the main body.

19 Claims, 7 Drawing Sheets

(58) Field of Classification Search
USPC .......................................................... 165/185
See application file for complete search history.

(56) References Cited

U.S. PATENT DOCUMENTS

| | | | |
|---|---|---|---|
| 6,671,957 B2 * | 1/2004 | Diels ................... | H01L 21/4882 |
| | | | 165/185 |
| 7,151,669 B2 * | 12/2006 | Liu ..................... | H01L 23/4093 |
| | | | 165/185 |
| 2003/0169983 A1 | 9/2003 | Branch et al. | |
| 2008/0068805 A1 | 3/2008 | Xu et al. | |
| 2011/0198068 A1 * | 8/2011 | Chen ................... | H01L 23/3672 |
| | | | 165/185 |
| 2012/0040223 A1 * | 2/2012 | Odumodu ........... | H01M 50/296 |
| | | | 165/185 |
| 2015/0289415 A1 * | 10/2015 | Wong .................. | H01L 23/3672 |
| | | | 165/185 |

FOREIGN PATENT DOCUMENTS

| | | |
|---|---|---|
| DE | 102009012042 | 9/2010 |
| DE | 102011076325 | 11/2012 |

* cited by examiner

COOLING DEVICE FOR COOLING A SEPARATE OBJECT TO BE COOLED

The present application is a U.S. national phase application of International Application No. PCT/EP2020/056451, filed Mar. 11, 2020, which, in turn, claims the right of priority to German Application No. 102019107280.8, filed Mar. 21, 2019, the disclosures of both of which are hereby incorporated by reference herein in their entirety for all purposes.

The invention relates to a cooling device for cooling a separate object to be cooled, in particular a technical component.

Corresponding cooling devices are known in principle from the prior art. Here, the cooling devices are usually fastened to a separate object and have an enlarged surface area, for example produced by cooling ribs, such that thermal energy can be transferred between the cooling device or the separate object to be cooled provided with the cooling device and the ambient air surrounding the cooling device.

The object of the invention is to provide a cooling device which can be manufactured in particular in a simple, rapid and cost-effective manner.

The object is achieved by a cooling device for cooling a separate object to be cooled, in particular a technical component, according to claim 1. The claims that are dependent thereon relate to possible embodiments of the cooling device.

The invention relates to a cooling device for cooling a separate object to be cooled, in particular a technical component, which comprises at least one cooling-rib body comprising a plurality of cooling ribs and at least one main body. The cooling device is characterized in that the cooling device comprises at least one main body that is open on at least one side, in particular when viewed in cross section, and defines a receiving space configured to receive at least one cooling-rib body, the at least one cooling-rib body comprising at least one fastening element, which is configured to interact with the at least one main-body-side fastening element to form a fastening between the at least one cooling-rib body received in the receiving space and the main body, and the main body comprising at least one fastening element, which is configured to interact with at least one cooling-rib-body-side fastening element to form a fastening between the at least one cooling-rib body received in the receiving space and the main body. In other words, with such a construction, a connection method for a multi-part cooling device is provided, with the cooling device being able to be manufactured in a simple and cost-effective manner. A main-body-side fastening element can be arranged or formed on the main body. Likewise, a cooling-rib-body-side fastening element can be arranged or formed on the cooling-rib body. In other words, the relevant fastening element can be provided on the main body and/or the cooling-rib body as an integral element, i.e. as an element made of a single piece of material, for example. As an alternative, at least one fastening element of the main body and/or the cooling-rib body can be fastened to the main body and/or the cooling-rib body as a separate component, in particular such that it cannot be detached without being destroyed. The cooling-rib body can be fastened to the main body directly or indirectly. The main body and/or the cooling-rib body is/are preferably produced in an extrusion process, in particular in a process that forms an aluminum extruded profile. Here, this may for example be an aluminum extruded profile produced from aluminum and/or another metal, such as magnesium, copper, etc. Because the cooling device is constructed as a multi-part cooling device by means of the at least one main body and the at least one cooling-rib body, a compact cooling device can be obtained that has a surface area that is highly effective for cooling at the same time. In particular when the main body and/or at least one cooling-rib body is formed as an extruded profile in particular consisting of aluminum, good cooling performance of the cooling device can be obtained despite any potential manufacturing-related limitations of the geometric configuration of the cooling device owing to the extrusion process used. Because the cooling device is constructed in multiple parts, a more complex shape, in particular a complex cross-sectional shape, of the multi-part cooling device can be obtained in a simple manner. By comparison with a cooling device that is produced in one piece in an extrusion process, in a cooling device constructed in multiple parts from at least one extruded profile, more design options are provided for its shape and cross-sectional contour. Here, the optional cross-sectional view of the main body which is open on at least one side may represent an opening on the lateral surface of a body of which the basic shape is prismatic. This opening or open region may in particular also be present in the assembled state and/or in the final assembled state. Preferably, the at least one opening on the lateral surface of the prismatic body extends along its manufacturing axis, with the manufacturing axis constituting the direction of movement during the extrusion shaping. For example, the prismatic body has the shape of an irregularly shaped prismatic profile, which is formed to be open or recessed on one side. Here, in the extrusion process, a mold can be used which comprises at least one shaping element, in particular a raised element, which, at least in regions, forms the opening in the main body which is open at least on one side during the extrusion process. The longitudinal axis of a cooling-device component produced in an extrusion process can be oriented to correspond to the manufacturing axis or to be parallel thereto and/or can extend at right angles to the manufacturing axis.

The separate object to be cooled by means of the cooling device may be an electrical and/or electronic component, in particular power electronics. The cooling device may be connected to the separate object so as to be in thermal contact therewith, preferably planar thermal contact therewith. The contact between the cooling device and the separate object may configured as direct contact at least in portions, for example. The cooling device may be fastened or connected to the separate object in a form-fitting, material-bonded and/or force-locked manner. Typically, the cooling device can be bonded to a surface of the separate object that corresponds to a contact surface of the cooling device. Overall, a cooling device is obtained which can be manufactured with reduced material complexity, has a compact form and is also characterized by high cooling performance.

In a preferred embodiment, the main body comprises a plurality of additional cooling ribs, which are in particular oriented in parallel and are arranged or formed on a wall of the cooling body defining the receiving space so as to extend into the receiving space. Therefore, the main body can consist both of a first region that predominantly ensures the stability of the main body itself and of another region provided with additional cooling ribs. Here, an additional cooling rib of the main body means that, aside from the plurality of cooling ribs of the cooling-rib body, the cooling device provides additional cooling ribs on the main body, which are in particular integrally formed with the main body or are made of a single piece of material therewith. Because the cooling ribs of the main body are oriented in parallel with one another, a compact arrangement of the cooling ribs can be achieved together with a high surface-to-volume ratio for the cooling device at the same time. For example, the main body may provide a greater wall thickness than the cooling ribs for the wall adjacent to the receiving space. Therefore, at least one wall of the main body defining the receiving space has a stabilizing function for the cooling device. The wall of the main body may be formed to be closed at least in portions. In particular, a portion of the main body forming the defining wall of the receiving space may be provided as a contact region for in particular direct contact with the separate object to be cooled. The wall defining the receiving space can usually be provided with through-holes or openings in portions. Through-holes or apertures of this kind in at least one wall portion, defining the receiving space, of the main body can increase the surface area of the cooling device and/or can result in improved thermal energy transfer between the cooling device and an in particular liquid or gaseous medium flowing around and/or through the cooling device. The latter effect can be brought about by a targeted flow profile of the medium that is guided around or through the apertures.

The at least one main-body-side fastening element may be arranged or formed on at least one cooling rib of the main body, for example. As a result, the cooling-rib body is fastened to the main body by the cooling ribs of the main body at least in portions. Therefore, the cooling ribs of the main body are given a double function, i.e. both the function of a heat exchanger or for transferring thermal energy between the main body and the medium surrounding the main body and a function of fastening the cooling-rib body to the main body.

In another optional configuration, it may be provided that the at least one main-body-side fastening element is arranged or formed in the region of the free end of the at least one cooling rib. A fastening element for attaching a cooling-rib body to the main body may thus be formed at the free tips or free ends of the cooling ribs of the main body at least in part, for example.

The at least one cooling-rib-body-side fastening element may be arranged or formed on at least one cooling rib of the at least one cooling-rib body. For example, the cooling-rib body comprises a plurality of cooling ribs, which are interconnected by a connection region at least in regions, with the connection or fastening between the cooling-rib body and the main body being implemented by means of the fastening elements arranged on the cooling ribs, in particular on the free ends of the cooling ribs.

Alternatively or additionally, it may be provided that the at least one cooling-rib-body-side fastening element is arranged or formed in the region of an end of the at least one cooling rib of the at least one cooling-rib body, which end is not exposed in the assembled state of the cooling device in which the at least one cooling-rib body is received in the receiving space delimited on the main-body side. It may thus be provided that the fastening element of the cooling-rib body is arranged on an end of the cooling-rib body closest to the main body, in particular in the assembled state. For example, the cooling-rib body is in the shape of a comb in cross section, according to which a connection region or main portion is provided from which individual cooling ribs, preferably all the cooling ribs, extend into one side, in particular a single side, substantially at right angles. In an embodiment of this kind, the fastening element of the cooling-rib body could be arranged on the side of the connection region of the comb-like cooling-rib body opposite the cooling ribs. Therefore, in the assembled state of the comb-like cooling-rib body, the cooling ribs or the free ends of the cooling ribs can extend in a direction away from the connection region. Where an assembled state is mentioned in the description, this can include an intermediate assembled state and/or a final assembled state of the multi-part cooling device.

It may prove advantageous for the length ratio of the main-body-side cooling ribs to the cooling-rib-body-side cooling ribs to be in a range of between 0.30 and 3.00, preferably in a range of between 0.50 and 2.0, particularly preferably in a range of from 0.65 to 1.55. Furthermore, it may be provided that the length ratio of the main-body-side and cooling-rib-body-side cooling ribs at least approximately corresponds to 1.0. In other words, the length ratio of the main-body-side and cooling-rib-body-side cooling ribs may be between 0.95 and 1.05. In particular when the main-body-side and cooling-rib-body-side cooling ribs are formed to be geometrically similar and/or identical or have an identical or similar length ratio, a more homogeneous flow of medium through and/or around the cooling ribs can be achieved.

It is possible for the cooling device to comprise a first cooling-rib body comprising a plurality of cooling ribs and a second cooling-rib body comprising a plurality of cooling ribs, the first cooling-rib body comprising at least one fastening element, which is configured to interact with the at least one main-body-side fastening element to form a fastening between the cooling-rib body received in the receiving space and the main body, and the second cooling-rib body comprising at least one fastening element, which is configured to interact with at least one fastening element of the first cooling-rib body to form a fastening between the second cooling-rib body and the first cooling-rib body. Therefore, a construction is obtained in which the second cooling-rib body is or can be connected to the main body at least in regions, and in particular exclusively, via its fastening to the first cooling-rib body. The second cooling-rib body may for example be exclusively supported by the first cooling-rib body. Provided that the first cooling-rib body is fastened to the main body here, this results in an exclusive fastening between the second cooling-rib body and the main body via the first cooling-rib body. In other words, the second cooling-rib body is exclusively connected or fastened to the main body indirectly via the first cooling-rib body. In particular when at least two cooling-rib bodies are directly interconnected or put together, it may be advantageous for the cooling ribs of the first cooling-rib body and the cooling ribs of the second cooling-rib body to be arranged or oriented in parallel with one another with regard to their respective main extension axes or their respective longitudinal axes in the assembled position. Alternatively, it may also be provided that at least some, in particular all, of the cooling ribs of the first cooling-rib body are in parallel with and offset from the cooling ribs of the second cooling-rib body or are arranged or oriented in parallel therewith.

It may for example be provided that the cooling ribs of the main body and the cooling ribs of the first cooling-rib body are oriented so as to be flush with one another in the longitudinal direction in the assembled state of the cooling device in which the cooling-rib body is received in the receiving space delimited on the main-body side, and/or the cooling ribs of the second cooling-rib body and the cooling ribs of the first cooling-rib body are oriented so as to be flush in the longitudinal direction in the state in which they are fastened to the first cooling-rib body as intended. Two groups of cooling ribs being oriented so as to be flush with one another means that the axes of longitudinal extension of the respective cooling ribs of the first cooling-rib body and the second cooling-rib body or of the main body and at least one cooling-rib body are on a common axis or in a common plane. In particular if the cooling ribs of a first and a second cooling-rib body and/or the cooling ribs of the main body and at least the first cooling-rib body are flush with one another in the assembled state, this may have the advantage of the cooling ribs being arranged more uniformly in the assembled state or in the usage state of the cooling device. The more uniform arrangement of the cooling ribs can result in a more homogeneous flow situation for the medium flowing around and/or through the cooling device and/or in a homogenous exchange of thermal energy between the cooling device and the medium flowing around and/or through said device.

Furthermore, it may prove advantageous for the at least one cooling-rib body to comprise a main portion that is rectangular, in particular when viewed in cross section, on which the cooling-rib-body-side cooling ribs are arranged or formed so as to extend, in particular so as to extend away from the main portion, and for the main body to comprise an in particular recess-like or recess-shaped receiving portion provided for this purpose in the region of a wall defining the receiving space, the at least one cooling-rib body being received in the receiving space delimited on the main-body side in the assembled state of the cooling device. The receiving portion may form a segment of the main body which is designed for fastening the cooling-rib body to be received in the receiving space. Here, the receiving portion may for example comprise a force-locked and/or form-fitting retaining element, which is designed in the manner of a clip connection or a snap-in latching connection, for example, and ensures that the cooling-rib body is retained on or in the main body. In order to improve the transfer of thermal energy from the main body to the cooling-rib body connected to the main body, it may be provided that a heat-conducting paste and/or a heat-conducting element, for example a heat-conducting foil, is applied or arranged between the main body and the cooling-rib body at least in portions. Furthermore, the transfer of thermal energy between the main body and the cooling-rib body connected to the main body can be improved by the cooling-rib body forming a predominantly, in particular completely, planar contact region with the main body over the receiving portion.

The at least one main-body-side fastening element and/or the at least one cooling-rib-body-side fastening element may for example be formed as form-fitting and/or force-locked elements configured to form a form-fitting and/or force-locked fastening. Typically, at least one fastening element, in particular the cooling-rib-body-side and main-body-side fastening elements provided for assembly, may be designed such that they form a connection in the manner of an interference fit. Alternatively or additionally, cooling-rib-body-side and/or main-body-side fastening elements may also be interconnected by caulking the fastening elements to one another; here, at least one of the two fastening elements can plastically deform, in particular during connection. The two fastening elements can thus be wedged together, for example such that they are not detachable, or cannot be detached without being destroyed. Alternatively or additionally, a material-bonded connection may be provided between the main-body-side and the cooling-rib-body-side fastening element and/or between a first cooling-rib-body-side fastening element and a second cooling-rib-body-side fastening element; in particular, the material-bonded connection may be formed during a welding process and/or an adhesion process. The examples set out herein for a force-locked and/or form-fitting connection of two fastening elements can relate to the interconnection of two cooling-rib bodies and/or the connection of at least one cooling-rib body to a main body.

The at least one main-body-side fastening element may be formed as or at least comprise a projection that is radially widened at least in portions, in particular when viewed in cross section, the at least one cooling-rib-body-side fastening element being formed as or at least comprising a recess and/or receptacle for receiving a corresponding projection. Alternatively or additionally, the at least one cooling-rib-body-side fastening element may be formed as or at least comprise a projection that is radially widened at least in portions, in particular when viewed in cross section, the at least one main-body-side fastening element being formed as or at least comprising a recess for receiving a corresponding projection. In the present sense, a projection that is radially widened "when viewed in cross section" means that a projection extends transversely to the longitudinal extension of a cooling rib or a projection extends radially from the longitudinal axis of the cooling rib, in particular perpendicularly to the longitudinal axis.

It is possible for the at least one main-body-side fastening element to be oriented and/or configured such that the at least one main-body-side and the at least one cooling-rib-body-side fastening element interact in an operative direction in parallel with the longitudinal extension of the cooling-rib-body-side cooling ribs. In other words, a joining direction for joining the main body to at least one cooling-rib body and/or for joining at least two cooling-rib bodies can extend in parallel with the longitudinal axis of the cooling-rib-body-side and/or main-body-side cooling ribs, or the components of the cooling device can be configured accordingly. In particular if the main-body-side fastening element is arranged on cooling ribs of the main body, it may prove advantageous for the cooling-rib-body-side cooling ribs and the main-body-side cooling ribs to be oriented in parallel with the joining direction and in particular additionally in parallel with the longitudinal extension of the cooling-rib-body-side cooling ribs. Because the cooling ribs of the cooling-rib body and the cooling ribs of the main body are oriented in parallel with one another, a joining force can act on the cooling device during the joining without resulting in cooling ribs bending or even buckling.

The at least one cooling-rib body may comprise a main portion which is in particular designed in an undulating or meandering manner and by means of which adjacently arranged cooling ribs are interconnected to form the cooling-rib body. Because the connecting portion or main portion connecting the individual cooling ribs of the cooling-rib body extend in this undulating or meandering manner, a compact form for the cooling-rib bodies can be achieved with little material being used at the same time. The main portion or connecting portion of the cooling-rib body may further comprise insertion chamfers, which, when assembling or joining together the cooling-rib body and the main portion, have a centering and/or guide function. In particular if, during this joining, at the same time, a plurality of raised portions of one fastening element have to be joined to corresponding recesses of the other fastening element of the connecting partner at the same time as far as possible, it is advantageous for them to be brought together with assistance or guidance from corresponding centering and/or insertion chamfers in the region of the main portion of the cooling-rib body.

Alternatively or additionally, at least one cooling-rib-body-side fastening element may be integrated in the main portion. In other words, the at least one cooling-rib-body-side fastening element, in particular all the cooling-rib-body-side fastening elements, is/are formed as an integral component of the cooling-rib body or is/are integrally formed in the main portion of the cooling-rib body.

In addition to the cooling device, the invention also relates to a cooling-rib body comprising a plurality of cooling ribs and at least one fastening element, which is configured to be fastened or fastenable to a fastening element of a cooling device described herein. Furthermore, the invention also relates to an assembly comprising a cooling device according to any of the preceding claims and a separate object to be cooled, wherein the cooling device is or can be connected to the separate object, in particular in a planar manner. In order to improve the heat-conducting function between the separate object and the cooling device, a heat-conducting paste and/or a heat-conducting element, e.g. a heat-conducting foil, can be arranged therebetween.

According to the invention, an assembly may also be provided which comprises a cooling device described herein, wherein the main body can be fastened to at least one first cooling-rib body and one second cooling-rib body, which is in particular different from the first cooling-rib body. Here, a set of a plurality of cooling-rib bodies can be provided, which may be designed to be different where appropriate and which are received in the receiving space in the main body as required.

The invention also relates to an assembly comprising a cooling device described herein, comprising a main body, wherein the main body can be fastened to at least one first cooling-rib body and one second cooling-rib body, which is in particular different from the first cooling-rib body. Therefore, the assembly may e.g. comprise two differently designed cooling-rib bodies, which can be inserted into the receiving spaces in differently designed main bodies as desired. For example, a second cooling-rib body is directly connected to the first cooling-rib body, in particular exclusively, and the first cooling-rib body is directly connected to the main body, in particular exclusively. Alternatively or additionally, a first and a second cooling-rib body may be arranged beside one another within a receiving space in the main body. That is to say, for example, that a first cooling-rib body is directly fastened on or in a main body, in particular exclusively, and a second cooling-rib body is arranged and fastened on or in the same main body, in particular exclusively. In other words, two in particular differently designed cooling-rib bodies may be arranged beside one another in the receiving space in the main body.

In another advantageous embodiment, the cooling device is constructed to be modular, such that at least two identical or different cooling-rib bodies can be received in the receiving space in the main body as desired. The at least two cooling-rib bodies can also be dimensioned and/or formed such that they have a grid dimension relative to one another, and therefore, for example, one large cooling-rib body or two small cooling-rib bodies can be received in the receiving space in the main body as desired. Alternatively, the grid dimension can be taken into account in the dimensioning and/or configuration of the main body and/or the at least two cooling-rib bodies such that, in the assembled state, a first group of identical cooling-rib bodies has an extension, in particular a longitudinal extension, which corresponds to an integer multiple of the extension, in particular the longitudinal extension, of a second group of identically formed cooling-rib bodies received in the recess in the main body in the assembled state. The modular construction makes it possible to use different or identical cooling-rib bodies for assembly in at least two identical or at least two different receiving spaces in main bodies.

Preferably, in this embodiment, the delimitation that is produced by the cooling-rib bodies and is directed towards the opening is identical irrespective of whether one large cooling-rib body or two small cooling-rib bodies are arranged or formed in the receiving space in the main body.

All the advantages, details, configurations and/or features of the cooling device according to the invention can be transferred or applied to the cooling body according to the invention and the assembly according to the invention.

The invention is explained in greater detail on the basis of embodiments in the drawings, in which.

Figure 1:
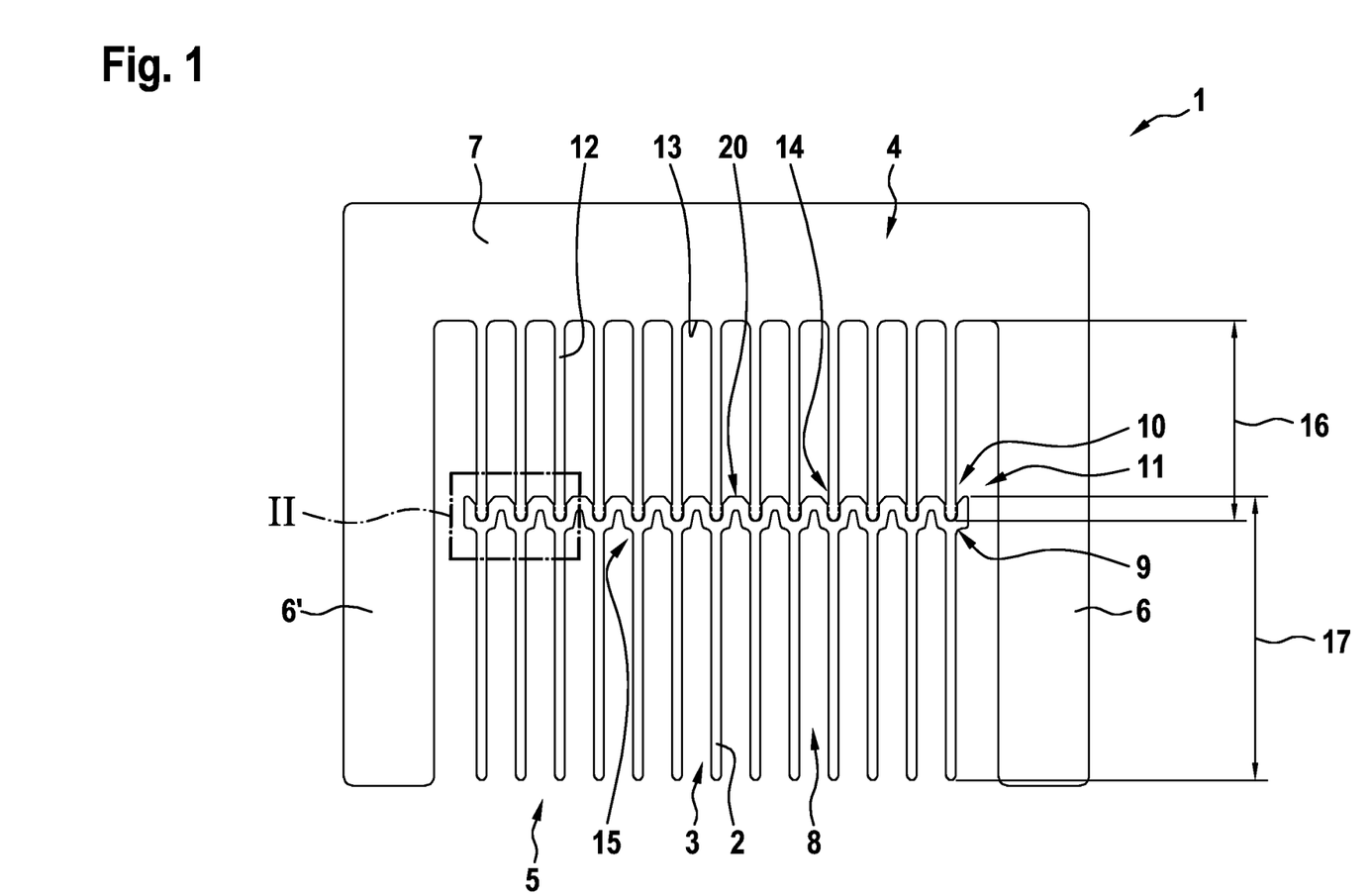
FIG. 1 is a schematic view of a cooling device according to an embodiment.
Figure 2:
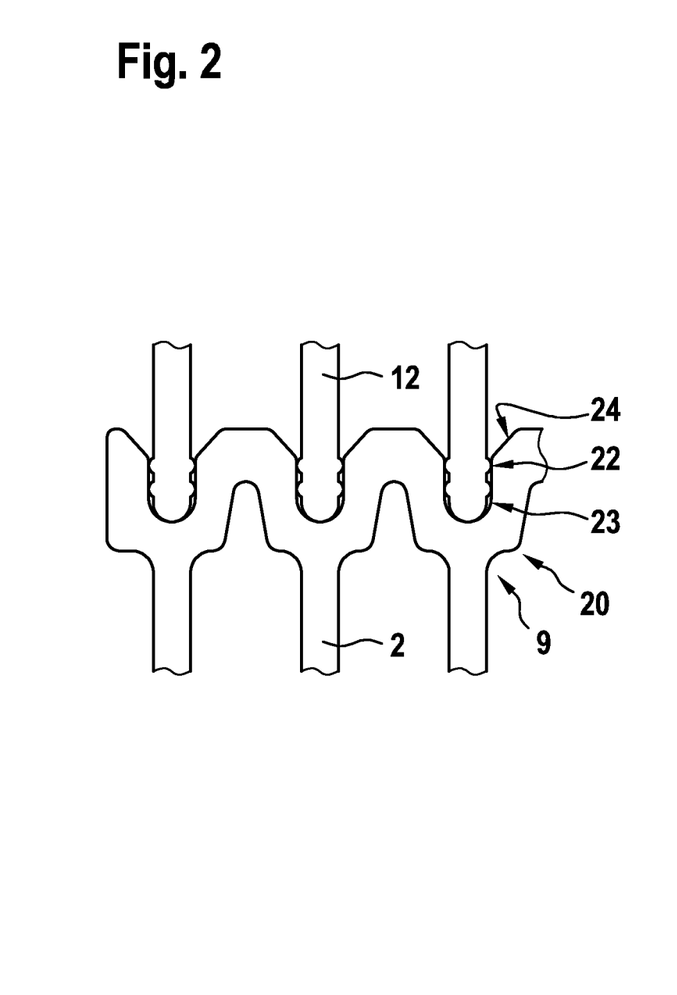
FIG. 2 is a schematic view of a detail of a cooling device according to FIG. 1.
Figure 3:
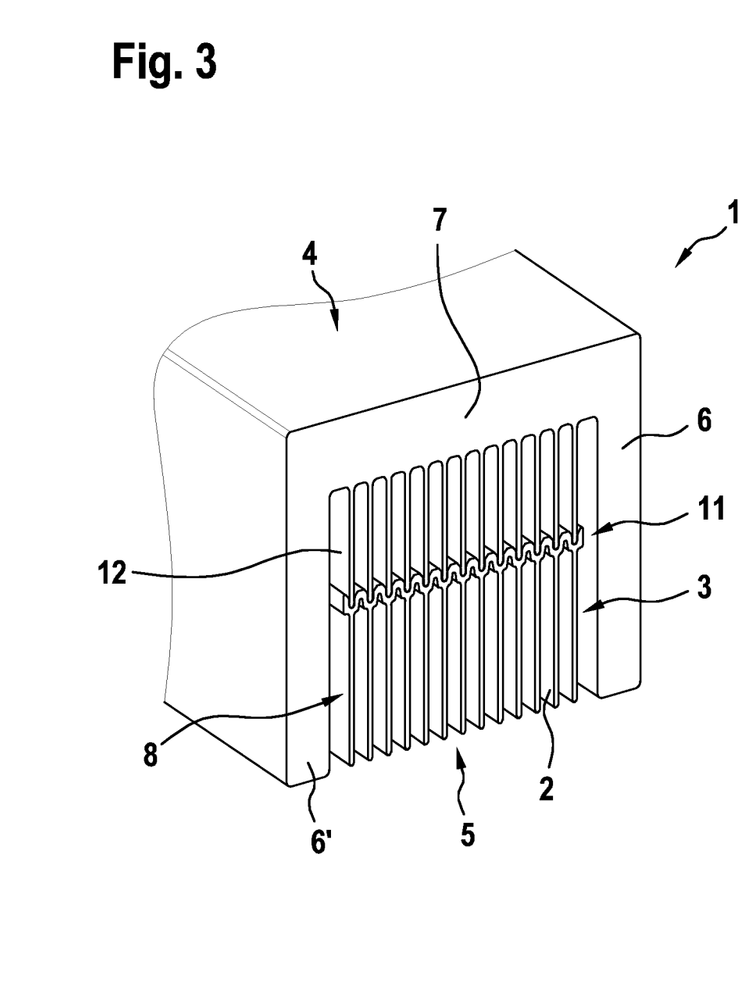
FIG. 3 is a schematic perspective view of a cooling device according to FIG. 1.

FIG. 1 shows a cooling device 1 for cooling a separate object (not shown) to be cooled, in particular a technical component (not shown). The cooling device 1 comprises at least one cooling-rib body 3, 3' comprising a plurality of cooling ribs 2, 2', and at least one main body 4 that is open on at least one side, in particular when viewed in cross section. In the embodiment according to FIG. 1, the main body 4 comprises a single opening 5 on one side. In other words, the main body 4 is U-shaped, with two legs 6, 6' being interconnected by a connecting portion 7 and the opening 5 being formed on the side of the cooling device 1 opposite the connecting portion 7. The opening 5 is delimited in the region of the free ends of the two legs 6, 6'.

As an alternative to a single opening 5, the main body 4, 4' may also comprise at least two openings 5, with it being possible for at least one of the legs 6, 6' and/or the connecting portion 7 to comprise an aperture (not shown) at least in portions. The main body 4, 4' defines a receiving space 8, 8' configured to receive at least one cooling-rib body 3, 3'. This receiving space 8, 8' is formed by the interior space in the substantially U-shaped main body 4, 4'. The at least one cooling-rib body 3, 3' comprises at least one fastening element 9, 9', which is configured to interact with the at least one main-body-side fastening element 10 to form a fastening 11 between the at least one cooling-rib body 3, 3' received in the receiving space 8, 8' and the main body 4. In addition, the main body 4, 4' comprises at least one fastening element 10, which is configured to interact with at least one cooling-rib-body-side fastening element 9, 9' to form a fastening 11 or connection between the at least one cooling-rib body 3, 3' received in the receiving space 8, 8' and the main body 4, 4'.

The main body 4, 4' comprises a plurality of, i.e. e.g. at least two, additional cooling ribs 12, which are in particular oriented in parallel and are arranged or formed on a wall 13 of the main body 4, 4' defining the receiving space 8, 8' so as to extend into the receiving space 8, 8'. As shown in FIG. 1, the wall 13 is preferably formed by the surface of the connecting portion 7 of the U-shaped main body 4, 4' facing the receiving space 8, 8'. The wall 13 or the connecting portion 7 and/or at least one leg 6, 6' may optionally comprise apertures (not shown), which e.g. allow a medium surrounding the cooling device 1 to pass through.

The at least one main-body-side fastening element 10 is for example arranged or formed on at least one cooling rib 3 of the main body 4. In particular, the at least one main-body-side fastening element 10 may be arranged or formed in the region of the free end 14 of the at least one cooling rib 12. As shown, it may prove advantageous for at least two, preferably at least half of, and particularly preferably all the main-body-side cooling ribs 12 to each be provided with a main-body-side fastening element 10. Here, all the main-body-side fastening elements 10 may for example be arranged or formed to be in a common plane. Alternatively or additionally, it may also prove advantageous for at least two, preferably at least half of, and particularly preferably all the main-body-side fastening elements 10 to be arranged or formed to be in a common plane and for this common plane to be oriented in parallel with a main plane of extension of the main body, a main plane of extension of the connecting portion and/or the main plane of extension of at least one leg 6, 6'.

The at least one cooling-rib-body-side fastening element 9, 9' may for example be arranged or formed on at least one cooling rib 2, 2' of the at least one cooling-rib body 3, 3'. As a result, a compact form of the cooling-rib body 3, 3' inserted in or attached to the main body 4, 4' can be obtained. Here, the at least one cooling-rib-body-side fastening element 9, 9' may be arranged or formed in the region of an end 15, 15' of the at least one cooling rib 2, 2' of the at least one cooling-rib body 3, 3', which end is not exposed in the assembled state of the cooling device 1 in which the at least one cooling-rib body 3, 3' is received in the receiving space 8, 8' delimited on the main-body side. In other words, the cooling-rib-side fastening element 9, 9' is arranged or formed on an in particular distal end region of the at least one cooling rib 2, 2' of the cooling-rib body 3, 3' that is remote from the opening 5 in the assembled state, in particular from the opening 5 that allows medium to pass through the cooling-rib body 3, 3' into the receiving space 8, 8' in the main body 4, 4'. In other words, the cooling-rib-side fastening elements 9, 9' may be arranged on the exposed end and/or on the end 15, 15' of the cooling rib 2, 2' opposite the end of the cooling ribs 2, 2' closest to the opening.

In the embodiment shown in FIG. 1, it may be provided that the length ratio of the main-body-side cooling ribs 12 to the cooling-rib-body-side cooling ribs 2, 2' is in a range of between 0.30 and 3.00, preferably in a range of between 0.50 and 2.0, particularly preferably in a range of from 0.65 to 1.55, most preferably in a range of 0.95 and 1.05. In other words, the cooling ribs 2, 2', 12 are designed such that the ratio of the length 16 of the main-body-side cooling ribs 12 to the length 17 of the cooling-rib-body-side cooling ribs 2, 2' is in the above-mentioned ranges. Here, in general, the maximum, minimum and/or mean length 16, 17 (in particular averaged using the arithmetic mean, mean square and/or averaged by a median) of the cooling-rib-body-side and/or the main-body-side cooling ribs 2, 2', 12 can be taken into account for calculating the ratio, for example. In the embodiment shown, all the cooling-rib-body-side cooling ribs 2, 2' have an identical length 17. All the main-body-side cooling ribs 12 also have an identical length 16. Therefore, in principle, embodiments are possible in which the cooling-rib-body-side and/or main-body-side cooling ribs 2, 2', 12 are the same length and therefore have a ratio of at least approximately 1.0. In other words, the length ratio of the main-body-side cooling ribs 12 to the cooling-rib-body-side cooling ribs 2, 2' may be in a range of between 1.0 to 1.5 and/or 1.5 to 1.0.

Figure 4:
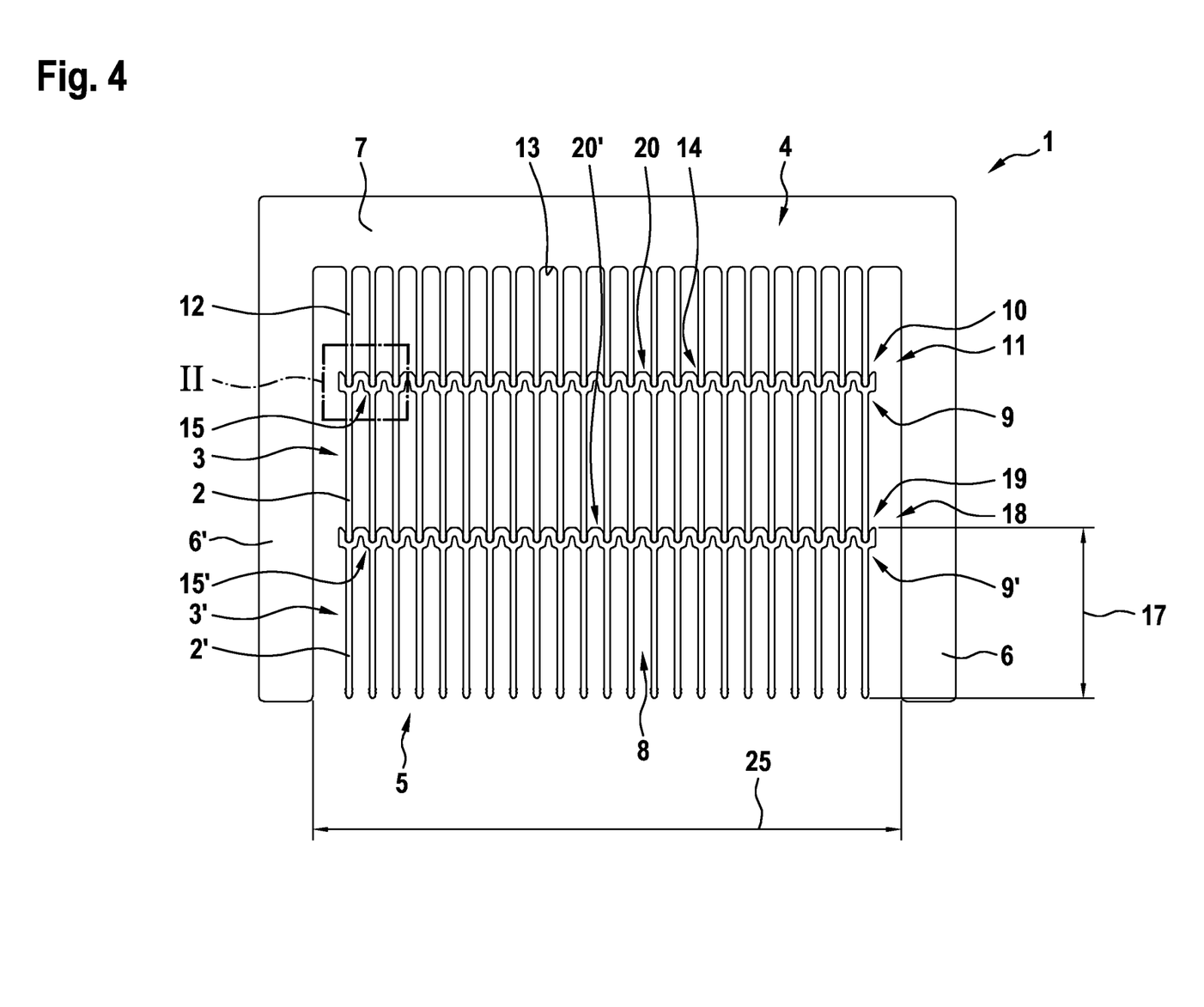
FIG. 4 is a schematic view of a cooling device according to an embodiment.
Figure 5:
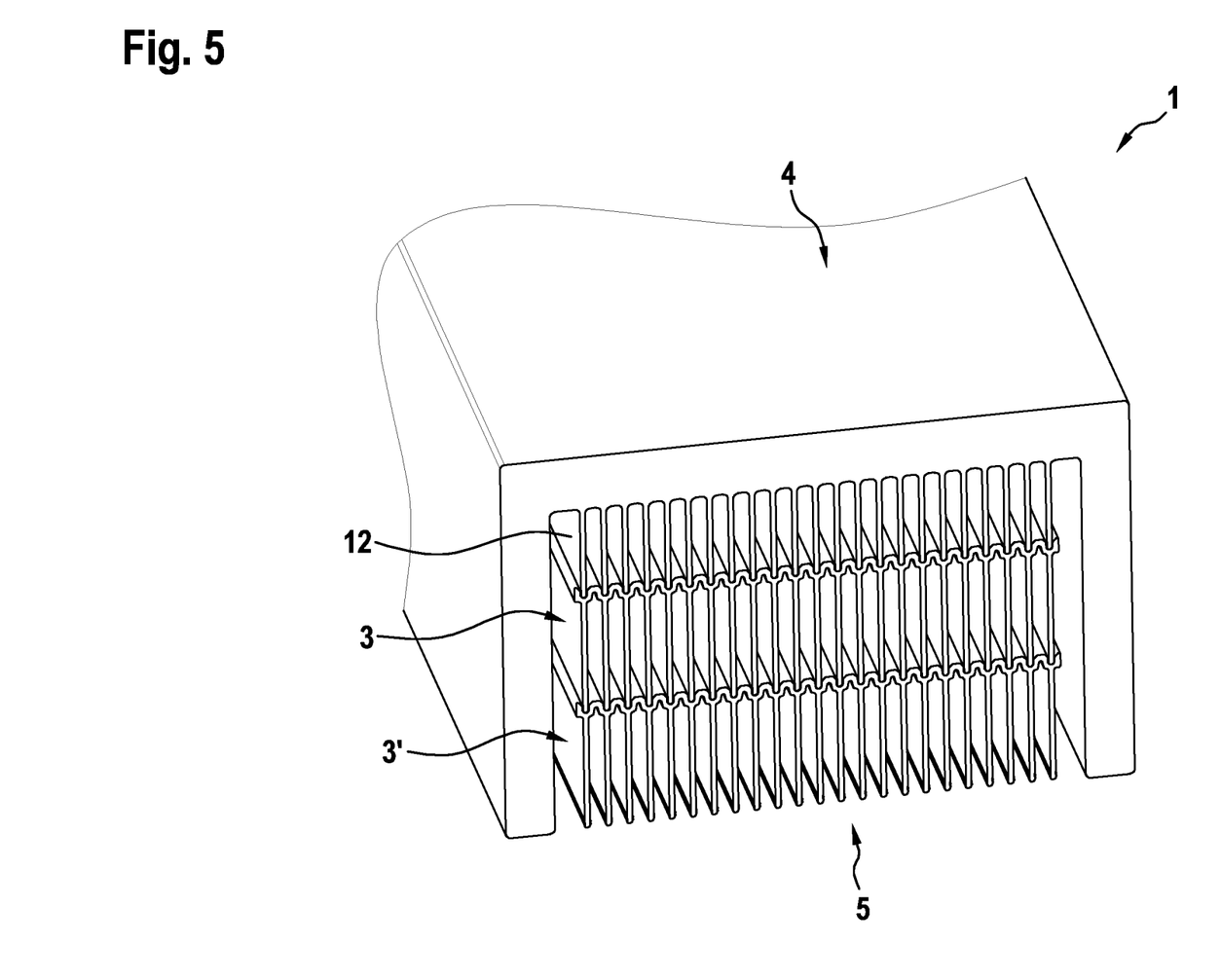
FIG. 5 is a schematic perspective view of a cooling device according to FIG. 4.
Figure 6:
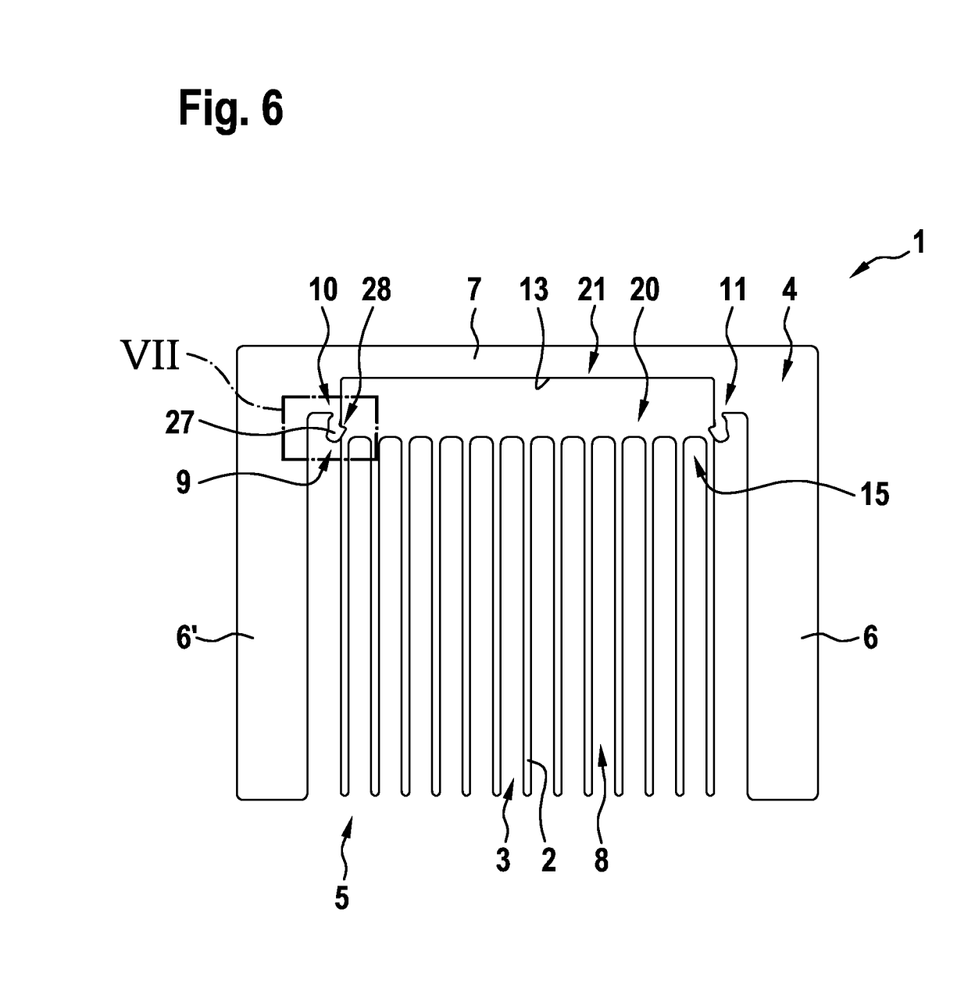
FIG. 6 is a schematic view of a cooling device according to an embodiment.
Figure 7:
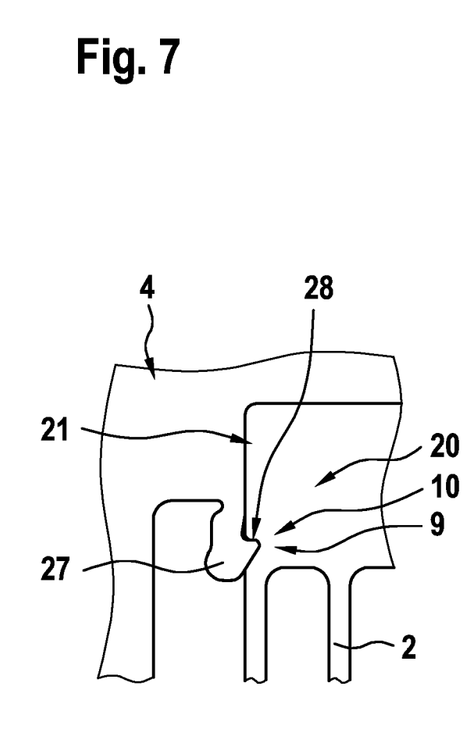
FIG. 7 is a schematic view of a detail of a cooling device according to FIG. 6.
Figure 8:
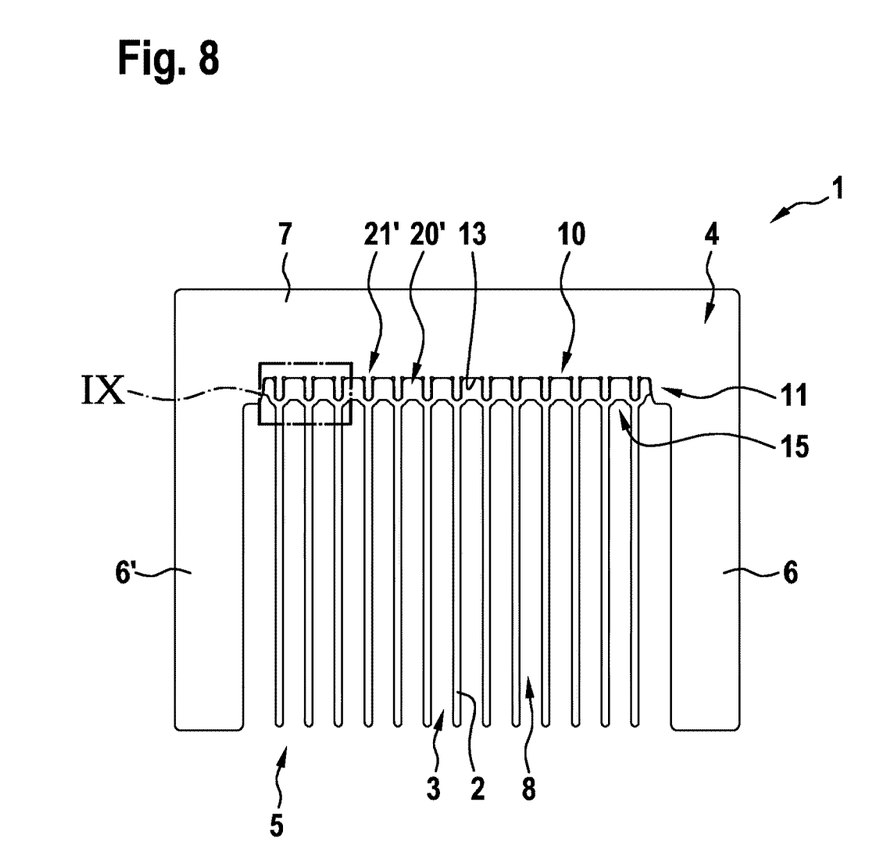
FIG. 8 is a schematic view of a cooling device according to an embodiment.
Figure 9:
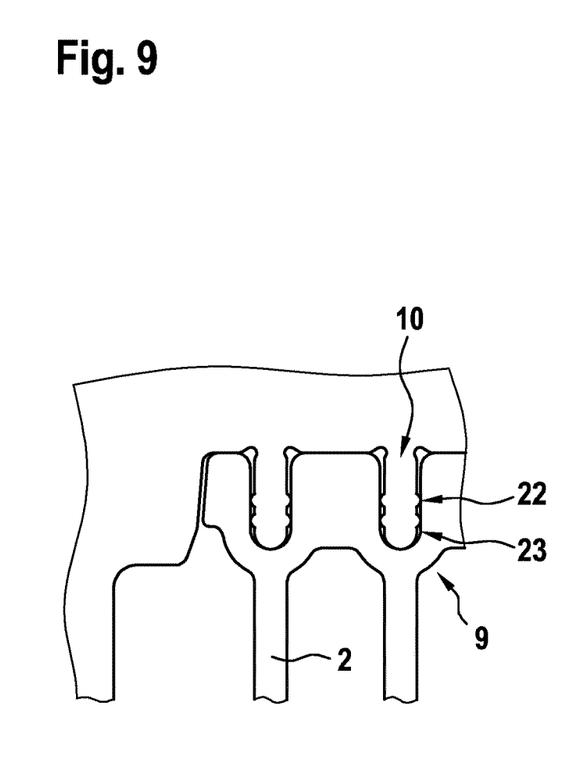
FIG. 9 is a schematic view of a detail of a cooling device according to FIG. 8.

According to FIG. 4, a cooling device 1 is shown which comprises a first cooling-rib body 3 comprising a plurality of cooling ribs 2 and a second cooling-rib body 3' comprising a plurality of cooling ribs 2', the first cooling-rib body 3 comprising at least one fastening element 9, which is configured to interact with the at least one main-body-side fastening element 10 to form a fastening 11 between the cooling-rib body 3 received in the receiving space 8, 8' and the main body 4, 4', and the second cooling-rib body 3' comprising at least one fastening element 9', which is configured to interact with at least one, in particular additional, fastening element 19 of the first cooling-rib body 3 to form a fastening 18 or connection between the second cooling-rib body 3' and the first cooling-rib body 3. It can be seen that, in the embodiment shown by way of example in FIG. 4, the first cooling-rib body 3 arranged between the main body 4 and the second cooling-rib body 3' comprises two fastening elements 9, 19, the fastening element 9 being used for the connection to the main-body-side fastening element 10 and the (additional) fastening element 19 being used for the connection to the fastening element 9' arranged on or in the second cooling-rib body 3'. Here, the additional fastening element 19 of the first cooling-rib body 3 closest to the second cooling-rib body 3' in the assembled state and the main-body-side fastening element 10 may be designed or configured at least to be of the same kind and/or similar and/or identical, for example. Alternatively or additionally, the fastening element 9 of the first cooling-rib body 3 closest to the main body 4, 4' in the assembled state and the fastening element 9' of the second cooling-rib body 3' closest to the first cooling-rib body 3 in the assembled state may be designed at least to be of the same kind and/or similar and/or identical, for example. For example, this makes it possible for the at least two cooling-rib bodies 3, 3' to be received in a receiving space 8, 8' in the main body 4, 4' to be formed to be of the same kind and/or identical with regard to the fastening elements 9, 9', 19. In particular, the at least two cooling-rib bodies 3, 3' to be received in the interior space 8, 8' in the main body 4, 4' in the assembled state may be configured as identical parts, i.e. the at least two cooling-rib bodies 3, 3' can be joined to one another and at least one cooling-rib body 3, 3' can be joined to the main body 4, 4' irrespective of the order in which the respective cooling-rib bodies 3, 3' are assembled. Furthermore, it can be seen from FIG. 4 that the second cooling-rib body 3' is connected to the main body 4 exclusively by its contact with or connection 18 to the first cooling-rib body 3. Therefore, the second cooling-rib body 3' can be supported exclusively by the first cooling-rib body 3, i.e. the second cooling-rib body 3' does not have a direct connection to the main body 4.

Alternatively or additionally, the main body 4, 4' and/or at least one cooling-rib body 3, 3' may have a shape that is mirror-symmetrical, in particular when viewed in cross section.

The cooling ribs 12 of the main body 4, 4' and the cooling ribs 2 of the first cooling-rib body 3 or of the additional cooling-rib body 3' may be oriented so as to be flush with one another in the longitudinal direction in the assembled state of the cooling device 1 in which the cooling-rib body 3 is received in the receiving space 8, 8' delimited on the main-body side, and/or the cooling ribs 2' of the second cooling-rib body 3' and the cooling ribs 2 of the first cooling-rib body 3 are oriented so as to be flush with one another in the longitudinal direction in the state in which they are fastened to the first cooling-rib body 3 as intended; cf. FIGS. 1 to 5. In other words, the central longitudinal axis (in particular when viewed in cross section) of the main-body-side cooling ribs 12 and the central longitudinal axis (in particular when viewed in cross section) of the cooling ribs 2 of the first cooling-rib body 3 coincide or lie on a common axis; cf. FIG. 2. In an analogous manner, the central longitudinal axis (in particular when viewed in cross section) of the cooling ribs 2 of the first cooling-rib body 3 coincide with or lie on a common axis with the central longitudinal axis (in particular when viewed in cross section) of the cooling ribs 2' of the second cooling-rib body 3' fastened to the first cooling-rib body 3.

In the exemplary embodiments according to FIGS. 6 to 9, the at least one cooling-rib body 3, 3' may for example comprise a main portion 20, 20' that is rectangular, in particular when viewed in cross section, on which the cooling-rib-body-side cooling ribs 2, 2' are arranged or formed so as to extend, and the main body 4, 4' comprises an in particular recess-like or recess-shaped receiving portion 21, 21' provided for this purpose in the region of a wall 13 defining the receiving space 8, 8', the at least one cooling-rib body 3, 3' being received in the assembled state of the apparatus or cooling device 1 in which the at least one cooling-rib body 3, 3' is received in the receiving space 8 delimited on the main-body side. In particular, the main portion 20, 20' of the cooling-rib body 3, 3', which is rectangular in cross section, is arranged or configured such that a cooling-rib body 3, 3' produced in an extrusion process has a rectangular shape at least transversely to the extruded profile forming said body, i.e. at least transversely to the movement of the billet through the die. Alternatively or additionally, the cooling-rib body 3, 3' may have a comb-like shape when viewed in cross section; in this case, the main portion 20, 20' may act as a connection region for connecting the at least two cooling ribs 3, 3' to one another within a cooling-rib body 2, 2'. According to the embodiment in FIG. 6, the main body 20 of the cooling-rib body 3 may be received or connected in the receiving portion 21 of the main body 4 in a force-locked and/or form-fitting manner. To do this, the main portion 20 may be connected to the receiving portion 21 by means of a shrink joint. Form-fitting elements may also be provided, which are e.g. in the form of latching tabs 27, in particular latching tabs 27 or latching strips extending over the longitudinal extension of the main body 4, 4' and/or over the longitudinal extension of the cooling-rib body 3, 3', and are operatively connected to corresponding mating latching elements 28 or mating latching strips. According to the embodiment shown in FIGS. 8 and 9, fastening elements 10, which are operatively connected to corresponding fastening elements 9 of the cooling-rib body 3, are arranged on the wall 13 of the main body 4, 4'.

It is possible for the at least one main-body-side fastening element 10 and/or the at least one cooling-rib-body-side fastening element 9, 9', 19 to be formed as form-fitting and/or force-locked elements configured to form a form-fitting and/or force-locked fastening 11, 18. Alternatively or additionally, at least one fastening 11, 18 or the interaction of the fastening elements 9, 9', 10, 19 may have an at least material-bonded connection component. Alternatively or additionally, in addition to form-fitting and/or force-locked elements, there may also be a material-bonded connection at another contact region of the main body 4, 4' to at least one cooling-rib body 3 that is directly in contact therewith and/or a material-bonded connection at another contact region of two cooling-rib bodies 3, 3' contacting one another. It may prove advantageous for a paste (not shown) and/or a foil (not shown) at least having a heat-conducting function, in particular a heat-conducting film and/or a heat-conducting paste, to be arranged between the main-body-side receiving portion 21, 21' and the cooling-rib-body-side main portion 20, 20', at least in the assembled state. In this case, the heat-conducting function of a paste and/or foil used may at least amount to a not inconsiderable effect of the paste or foil, and this is consistently the case when the thermal conductivity of the paste or foil is sufficiently high.

The at least one main-body-side fastening element 10 may for example be formed as or at least comprise a projection 22 that is radially widened at least in portions, in particular when viewed in cross section (e.g. of the main body 4, 4') and/or in longitudinal section of a raised fastening element 10, and the at least one cooling-rib-body-side fastening element 9 may be formed as or at least comprise a recess 23 for receiving a corresponding projection 22. Alternatively, the at least one cooling-rib-body-side fastening element 9, 9', 19 may be formed as or at least comprise a projection (not shown) that is radially widened at least in portions, in particular when viewed in cross section (e.g. of the main body 4, 4') and/or in longitudinal section of a raised fastening element 19, and the at least one main-body-side fastening element 10 may be formed as or at least comprise a recess for receiving a corresponding projection (not shown). A projection 22 which is received in a recess 23 in a connecting partner may alternatively or additionally be formed for a fastening 18 or connection of two cooling-rib bodies 3, 3' to one another, in addition to a fastening 11 or connection of a cooling-rib body 3 to the main body 4, 4'. In general, at least one projection 22 may be formed as a means that brings about a force-locked connection. In particular, by means of a corresponding configuration of the projections 22 together with the recesses 23 that receive said projections, an interference fit and/or a caulked fit may be formed.

The at least one main-body-side fastening element 10 may for example be oriented and/or configured such that the at least one main-body-side and the at least one cooling-rib-body-side fastening element 10, 9' interact in an operative direction in parallel with the longitudinal extension of the cooling-rib-body-side cooling ribs 2, 2'.

The at least one cooling-rib body 3, 3' may for example comprise a main portion 20, 20' or connection region which is in particular designed to extend in an undulating manner and by means of which adjacently arranged cooling ribs 2, 2' are interconnected to form the cooling-rib body 3, 3'. Alternatively or additionally, the main portion 20, 20' or connection region may have a meandering shape, with the cooling ribs 2, 2' in particular extending away from the main portion 20, 20' or connection region exclusively on one longitudinal side. Preferably, in the assembled state, the cooling ribs 2, 2' extend on the side of the main portion 20, 20' remote from the main body 4, 4' and preferably starting from the main portion 20, 20' in the direction pointing away from the main body 4, 4'.

The main portion 20, 20' of the cooling-rib body 3, 3', in particular at least one recess 23 in the main portion 20, 20' of the cooling-rib body 3, 3', may comprise at least one insertion chamfer 24 or centering chamfer. The insertion chamfer 24 or centering chamfer may in particular make it easier to bring together or join a main body 4, 4' to a cooling-rib body 3, 3' and/or to bring together or join two cooling-rib bodies 3, 3' to be interconnected, since the insertion chamfer 24 allows for a forward movement, guided at least in portions, towards the final position when bringing said components together.

The at least one cooling-rib-body-side fastening element 9, 9' may preferably be integrated in the main portion 20, 20', i.e., for example, the cooling-rib-body-side fastening element 9, 9' is made of a single piece of material with the main portion 20, 20' or is integrally formed therewith. The fastening element 19 opposite the main portion 20, 20' may be made of a single piece of material with and therefore integrated with a cooling-rib body 3, 3' or with the cooling rib 2, 2' of a cooling-rib body 3, 3'.

An assembly may comprise a cooling device 1 described herein and a separate object (not shown) to be cooled, wherein the cooling device 1 is or can be connected to the separate object, in particular in a planar manner. In particular, both the cooling device 1 and the separate object may each comprise a planar region which allows for planar contact in the assembled state and therefore they allow for good transfer of thermal energy between the cooling device 1 and the separate object.

Figure 10:
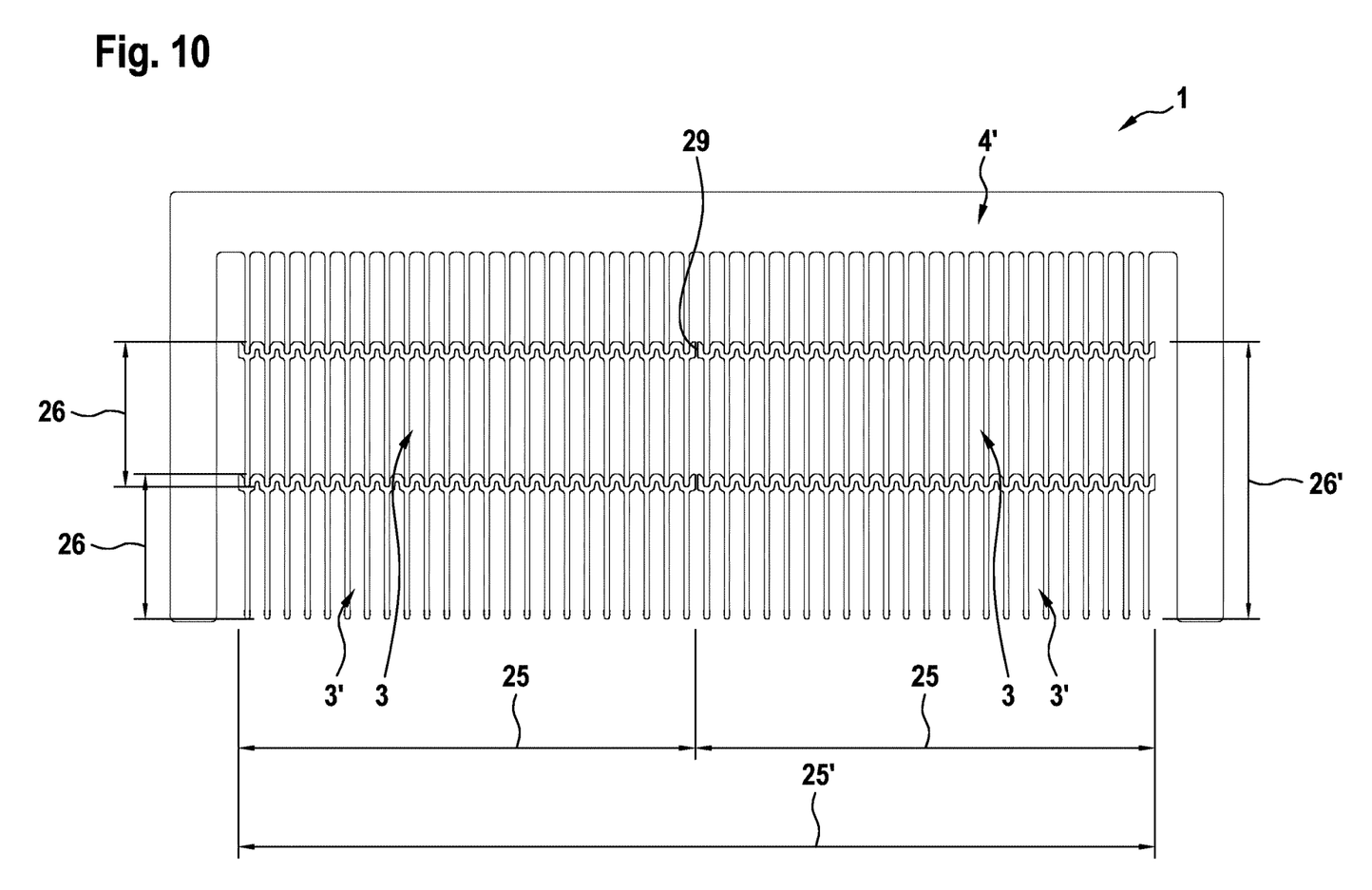
FIG. 10 is a schematic view of a cooling device according to an embodiment.

An assembly may for example also be provided which comprises a cooling device 1 described herein, wherein the main body 4, 4' can be fastened or connected to at least one first cooling-rib body 3, in particular directly, and to at least one additional cooling-rib body, which is in particular different from or identical to the first cooling-rib body, preferably directly. It may prove advantageous for the cooling-rib bodies 3, 3' to be dimensioned such the dimensioning corresponds to a grid dimension, i.e. a first cooling-rib body 3 may have an identical or non-identical, in particular integer, n-fold cooling-rib body length 25, 25'' and/or an in particular integer, n-fold cooling-rib body height 26, 26'' relative to an additional cooling-rib body. As a result, a first main body 4 as shown in FIG. 4 for example only receives two cooling-rib bodies 3, 3', which each form a layer. A second main body 4' as shown in FIG. 10, which, with regard to the receiving space 8', may be formed to be double the length of the receiving space 8 of the main body 4 as shown in FIG. 4 can receive the cooling-rib bodies 3, 3' (already shown in FIG. 4) in or on a first partial space (see right-hand side) of the receiving space 8' and can receive two additional cooling-rib bodies 3, 3' in or on an additional partial space (see left-hand side) of the receiving space 8', with the two additional cooling-rib bodies 3, 3' being able to be designed to be identical to the cooling-rib bodies 3, 3' on the left-hand side. In other words, a total of four cooling-rib bodies 3, 3', which each have a consistent cooling-rib body height 26 and a consistent cooling-rib body length 25, can be received in or on the main body 4' or in its receiving space 8'. Therefore, these four cooling-rib bodies 3, 3' can be provided as identical parts. The cooling-rib bodies 3, 3' arranged within one layer or plane may contact one another at their separation point 29 or may be arranged so as to be spaced apart from one another. If there is contact between at least two adjacent cooling-rib bodies 3, 3', the transfer of thermal energy between the at least two cooling-rib bodies 3, 3' at the separation point 29 can be promoted. This can boost the performance of the cooling device 1. Alternatively, it may be provided that two cooling-rib bodies 3, 3' are arranged or formed on the left-hand side of the receiving space 8' of the main body 4' and a single, additional cooling-rib body (not shown) is arranged or formed on the right-hand side, which has a cooling-rib body height 26' that corresponds to an in particular integer, n-fold (here double the) cooling-rib body height 26 of the cooling-rib body or bodies 3, 3'. In particular, an additional cooling-rib body may have a cooling-rib body height 26' that corresponds to the cooling-rib body height 26 of at least two first cooling-rib bodies 3, 3'. Alternatively or additionally, two cooling-rib bodies arranged in parallel with one another may also be received in the receiving space 8', which bodies each have a cooling-rib body length 25' and a cooling-rib body height 26. In general, a set of cooling-rib bodies 3, 3' can be provided which can be received in the receiving space 8, 8' in the main body 4, 4' depending on the dimensions of the main body 4, 4' and/or depending on the desired performance of the cooling device 1 (for example, not all the partial spaces in the receiving space 8, 8' are "filled" with cooling-rib bodies 3, 3' that can potentially be received and therefore a lower surface area of the cooling device 1 is obtained). Overall, a modular construction can be obtained which makes it possible to join a plurality of identical or different cooling-rib bodies 3, 3' to a plurality of identical or different main bodies 4, 4'.

The cooling device 1 may have a cuboid shape, which is rectangular when viewed in cross section, with the cooling-rib bodies 3, 3' arranged in the receiving space 8, 8' being oriented, arranged and/or dimensioned such that, in the assembled state, the cooling-rib bodies 3, 3' or the cooling ribs 2, 2' of the cooling-rib bodies 3, 3' do not project beyond the cross-sectional rectangular shape. In other words, in the assembled state, the cooling-rib bodies 3, 3' are flush with the opening 5 or flush with the free ends of the legs 6, 6' of the main body 4, 4'.

LIST OF REFERENCE SIGNS

1 Cooling device
2, 2' Cooling rib of 3, 3'
3, 3' Cooling-rib body
4, 4' Main body
5 Opening
6, 6' Leg
7 Connecting portion
8 Receiving space
9, 9' Fastening element of 3, 3'
10 Fastening element of 4
11 Fastening
12 Cooling rib of 4
13 Wall of 4
14 Free end of 12
15, 15' Non-exposed end of 2, 2'
16 Length of 12
17 Length of 2, 2'
18 Fastening
19 Fastening element
20, 20' Main portion of 3
21, 21' Receiving portion
22 Projection
23 Recess
24 Insertion chamfer
25, 25' Cooling-rib body length
26, 26' Cooling-rib body height
27 Latching tab
28 Mating latching element
29 Separation point

The invention claimed is:

1. A cooling device for cooling a separate object to be cooled, in particular a technical component, the cooling device comprising:
   at least one cooling-rib body comprising a plurality of cooling ribs, and
   at least one main body that is open on at least one side, in particular when viewed in cross section, and defines a receiving space configured to receive at least one cooling-rib body,
   wherein
   the at least one cooling-rib body comprises at least one fastening element, which is configured to interact with the at least one main-body-side fastening element to form a fastening between the at least one cooling-rib body received in the receiving space and the main body,
   the main body comprises at least one fastening element, which is configured to interact with at least one cooling-rib-body-side fastening element to form a fastening between the at least one cooling-rib body received in the receiving space and the main body,
   a first cooling-rib body comprising a plurality of cooling ribs and a second cooling-rib body comprising a plurality of cooling ribs, and
   the cooling ribs of the main body and the cooling ribs of the first cooling-rib body are oriented so as to be flush with one another in the longitudinal direction in the assembled state of the cooling device in which the cooling-rib body is received in the receiving space delimited on the main-body side, and/or the cooling ribs of the second cooling-rib body and the cooling ribs of the first cooling-rib body are oriented so as to be flush with one another in the longitudinal direction in the state in which they are fastened to the first cooling-rib body as intended.

2. The cooling device according to claim 1, wherein the main body comprises a plurality of additional cooling ribs, which are in particular oriented in parallel and are arranged or formed on a wall of the main body defining the receiving space so as to extend into the receiving space.

3. The cooling device according to claim 2, wherein the at least one main-body-side fastening element is arranged or formed on at least one cooling rib of the main body.

4. The cooling device according to claim 3, wherein the at least one main-body-side fastening element is arranged or formed in the region of the free end of the at least one cooling rib.

5. The cooling device according to claim 1, wherein the at least one cooling-rib-body-side fastening element is arranged or formed on at least one cooling rib of the at least one cooling-rib body.

6. The cooling device according to claim 5, wherein the at least one cooling-rib-body-side fastening element is arranged or formed in the region of an end of the at least one cooling rib of the at least one cooling-rib body, which end is not exposed in the assembled state of the cooling device in which the at least one cooling-rib body is received in the receiving space delimited on the main-body side.

7. The cooling device according to claim 2, wherein the length ratio of the main-body-side cooling ribs to the cooling-rib-body-side cooling ribs is in a range of between 0.30 and 3.00.

8. The cooling device according to claim 1, wherein
   the first cooling-rib body comprises at least one fastening element, which is configured to interact with the at least one main-body-side fastening element to form a fastening between the cooling-rib body received in the receiving space and the main body, and
   the second cooling-rib body comprises at least one fastening element, which is configured to interact with at least one fastening element of the first cooling-rib body to form a fastening between the second cooling-rib body and the first cooling-rib body.

9. The cooling device according to claim 1, wherein the at least one cooling-rib body comprises a main portion that is rectangular, in particular when viewed in cross section, on which the cooling-rib-body-side cooling ribs are arranged or formed so as to extend, and the main body comprises an in particular recess-like or recess-shaped receiving portion provided for this purpose in the region of a wall defining the receiving space, wherein the at least one cooling-rib body is received in the receiving space delimited on the main-body side in the assembled state of the cooling device.

10. The cooling device according to claim 1, wherein the at least one main-body-side fastening element and/or the at least one cooling-rib-body-side fastening element are formed as form-fitting and/or force-locked elements configured to form a form-fitting and/or force-locked fastening.

11. The cooling device according to claim 10, wherein the at least one main-body-side fastening element is formed as or at least comprises a projection that is radially widened at least in portions, in particular when viewed in cross section, and the at least one cooling-rib-body-side fastening element is formed as or at least comprises a recess for receiving a corresponding projection or
   the at least one cooling-rib-body-side fastening element is formed as or at least comprises a projection that is radially widened at least in portions, in particular when viewed in cross section, and the at least one main-body-side fastening element is formed as or at least comprises a recess for receiving a corresponding projection.

12. The cooling device according to claim 1, wherein the at least one main-body-side fastening element is oriented and/or configured such that the at least one main-body-side and the at least one cooling-rib-body-side fastening element interact in an operative direction in parallel with the longitudinal extension of the cooling-rib-body-side cooling ribs.

13. The cooling device according to claim 1, wherein the at least one cooling-rib body comprises a main portion which is in particular designed to extend in an undulating manner and by means of which adjacently arranged cooling ribs are interconnected to form the cooling-rib body.

14. The cooling device according to claim 9, wherein the at least one cooling-rib-body-side fastening element is integrated in the main portion.

15. A cooling-rib body comprising a plurality of cooling ribs and at least one fastening element, which is configured to be fastened or fastenable to a fastening element of the cooling device according to claim 1.

16. An assembly comprising the cooling device according to claim 1 and a separate object to be cooled, wherein the cooling device is or can be connected to the separate object, in particular in a planar manner.

17. An assembly comprising the cooling device according to claim 1, wherein the second cooling-rib body according to claim 1 can be fastened to the first cooling-rib body according to claim 1.

18. A cooling device for cooling a separate object to be cooled, in particular a technical component, the cooling device comprising:
   at least one cooling-rib body comprising a plurality of cooling ribs, and at least one main body that is open on at least one side, in particular when viewed in cross section, and defines a receiving space configured to receive at least one cooling-rib body, wherein the at least one cooling-rib body comprises at least one fastening element, which is configured to interact with the at least one main-body-side fastening element to form a fastening between the at least one cooling-rib body received in the receiving space and the main body, the main body comprises at least one fastening element, which is configured to interact with at least one cooling-rib-body-side fastening element to form a fastening between the at least one cooling-rib body received in the receiving space and the main body, and the at least one cooling-rib body comprises a main portion which is in particular designed to extend in an undulating manner and by means of which adjacently arranged cooling ribs are interconnected to form the cooling-rib body.

19. A cooling device for cooling a separate object to be cooled, in particular a technical component, the cooling device comprising:

at least one cooling-rib body comprising a plurality of cooling ribs, and at least one main body that is open on at least one side, in particular when viewed in cross section, and defines a receiving space configured to receive at least one cooling-rib body, wherein the at least one cooling-rib body comprises at least one fastening element, which is configured to interact with the at least one main-body-side fastening element to form a fastening between the at least one cooling-rib body received in the receiving space and the main body, the main body comprises at least one fastening element, which is configured to interact with at least one cooling-rib-body-side fastening element to form a fastening between the at least one cooling-rib body received in the receiving space and the main body, and a plurality of cooling ribs of the main body and the cooling ribs of the at least one cooling-rib body are oriented so as to be flush with one another in the longitudinal direction in the assembled state of the cooling device in which the cooling-rib body is received in the receiving space delimited on the main-body side.

* * * * *